(12) United States Patent
Moncayo

(10) Patent No.: US 10,212,807 B2
(45) Date of Patent: Feb. 19, 2019

(54) ELECTRICAL INTERFACE FOR PACKAGE AND DIE

(71) Applicant: MACOM Technology Solutions Holdings, Inc., Lowell, MA (US)

(72) Inventor: Alfredo Moncayo, Camarillo, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/826,424

(22) Filed: Nov. 29, 2017

(65) Prior Publication Data

US 2018/0103541 A1  Apr. 12, 2018

Related U.S. Application Data

(63) Continuation of application No. 15/185,387, filed on Jun. 17, 2016, now Pat. No. 9,848,488.

(51) Int. Cl.
| | |
|---|---|
| H05K 1/02 | (2006.01) |
| H05K 1/11 | (2006.01) |
| H01L 23/31 | (2006.01) |
| H01L 23/495 | (2006.01) |
| H01L 23/66 | (2006.01) |
| H01L 23/00 | (2006.01) |

(Continued)

(52) U.S. Cl.
CPC ........ *H05K 1/0246* (2013.01); *H01L 23/3114* (2013.01); *H01L 23/4952* (2013.01); *H01L 23/49541* (2013.01); *H01L 23/66* (2013.01); *H01L 24/49* (2013.01); *H05K 1/0251* (2013.01); *H05K 1/0298* (2013.01); *H05K 1/114* (2013.01); *H05K 1/181* (2013.01); *H01L 24/48* (2013.01); *H01L 2223/6611* (2013.01); *H01L 2224/48106* (2013.01); *H01L 2224/48227* (2013.01); *H01L 2224/48247* (2013.01); *H01L 2924/30111* (2013.01); *H05K 3/3421* (2013.01); *H05K 2201/09409* (2013.01)

(58) Field of Classification Search
CPC ...... H05K 1/0246; H05K 1/111–1/116; H05K 1/181; H05K 1/0215–1/0224
See application file for complete search history.

(56) References Cited

U.S. PATENT DOCUMENTS

| | | |
|---|---|---|
| 2005/0121752 A1 | 6/2005 | Lee |
| 2006/0022312 A1 | 2/2006 | Greeley |
| 2006/0180905 A1 | 8/2006 | Zeng |

(Continued)

*Primary Examiner* — Hoa C Nguyen
(74) *Attorney, Agent, or Firm* — Weide & Miller, Ltd.

(57) ABSTRACT

A circuit board and package assembly electrically connecting a die to a circuit board. The circuit board has signal paths terminating in a signal pad located on an insulating layer. The circuit board also includes a ground pad on the insulating layer that has a concave shaped side forming a recess, the with a signal pad at least partially within the recess. A package has package ground pads aligned with the circuit board ground pads and package signal pads aligned with circuit board signal pads. The package ground pads extend through the package to connect to package ground paths, which extend toward the die. The package signal pads extend through the package to connect to package signal paths and the package signal paths extend toward the die, maintaining a consistent distance from the package ground paths. Multiple-tier bond wires connect the package bond locations to the die bond pads.

20 Claims, 12 Drawing Sheets

(51) Int. Cl.
  *H05K 1/18* (2006.01)
  *H05K 3/34* (2006.01)

(56) References Cited

U.S. PATENT DOCUMENTS

| | | |
|---|---|---|
| 2007/0262836 A1 | 11/2007 | Voss |
| 2007/0279880 A1 | 12/2007 | Weir |
| 2008/0277152 A1* | 11/2008 | Watanabe ............. H05K 1/114 |
| | | 174/262 |
| 2012/0104588 A1 | 5/2012 | Chen et al. |
| 2012/0120619 A1 | 5/2012 | Kodera |
| 2012/0247825 A1 | 10/2012 | Wei et al. |
| 2013/0175077 A1 | 7/2013 | Kim |
| 2014/0293566 A1 | 10/2014 | Mizutani |
| 2015/0114706 A1* | 4/2015 | Rose ................... H05K 1/0245 |
| | | 174/262 |
| 2015/0195906 A1 | 7/2015 | Chang et al. |
| 2016/0374199 A1* | 12/2016 | Kondo .................. H01R 24/50 |
| 2017/0196079 A1 | 7/2017 | Morgan |
| 2017/0207579 A1 | 7/2017 | Patel |

* cited by examiner

ELECTRICAL INTERFACE FOR PACKAGE AND DIE

PRIORITY CLAIM

This application is a continuation of and claims priority to U.S. application Ser. No. 15/185,387 filed on Jun. 17, 2016, which application is expressly incorporated by reference herein.

FIELD OF THE INVENTION

The innovation relates to electrical connections between a printed circuit boards and a die and in particular to a novel layout for a printed circuit board to lead frame to die interface.

RELATED ART

Modern electronic circuits are contained on a die which is typically formed from a silicon wafer, but other materials or configuration are possible. The electronic circuits on the die perform the signal processing or other operations on the electrical signals as is understood in the art.

The die is typically contained within a package. The package surrounds the die and is formed from an insulating plastic, resin, or epoxy material. One or more pins extends outward from the package and the pins may be located on the sides or periphery of the package or on the bottom. An electrical connection must be made between the die and the pins of the package so that an electrical signal may be presented to the die and received from the die at the exterior of the package (or, presented to the package and received from the package at the die).

Supporting the package is a circuit board, which are common in the art. The circuit board is typically a multilayer structure of alternating insulating and conductive layers. The pins from the package connect to electrical conductors in the circuit board. The circuit board is then built to an electrical device, such as but not limited to communication equipment, computer devices, mobile communication devices, or any number of other devices that utilize electronic circuits.

One challenge and limiting factor to the advancement of circuit operation and data rates is the interface between the circuit board and the die. The path between the circuit board and the die can affect overall performance and be the limiting factor to performance.

The need was to create a low cost wire bonded package to achieve comparable electrical performance to a chip-scale package (CSP). While CSP has the advantage of not requiring bond wires which can impact and limit performance, CSP can suffer from other drawbacks—namely excess capacitive loading and hence system performance impairment. The issue with low cost wire-bonded packages (QFN or other technologies that use bond wires) is that it is difficult to achieve proper differential-mode and common-mode impedances in order to obtain desirable device-level return losses. The wire bonds also create bandwidth limitations that affect signal transmission, for example, rise/fall time and inter-symbol interference (ISI) jitter. In the design disclosed herein the bandwidth for the prior art configuration was limited in range from 20 GHz to 48 GHz depending on the application.

Prior solutions to overcome the drawbacks of the prior art typically optimize each segment individually and simply utilize known-configurations. The prior art does not address the interrelation between segments and does not account for modal transmission or propagation characteristics.

FIG. 1 illustrates an exemplary prior art conductor layout within a package for a circuit board to die interface. As shown, a die 104 is presented and asserted to include one or more electronic circuits (not shown). Around the die 104 is a package 120 (shown in cut away to aid in understanding). The package 120 includes conductive areas 116 and 124, namely ground node 116 and signal paths 124. The ground nodes electrically connect to the die 104 through one or more bond wires 108. The signal paths electrically connect to the die 104 through one or more bond wires 110. Also part of the package are pad 138 and signal path pad 130A, 130B. Through these pads 138, 130A, 130B in connection with one or more vias and conductive traces of the circuit board, the die electrically connects to the circuit board.

This prior art configuration shown in FIG. 1 suffers from the drawbacks mentioned above including poor return paths to ground, inductive and capacitive coupling, limited bandwidth performance, phase distortion, and other performance limiting drawbacks. An additional drawback with prior art designs is that each segment is evaluated alone which leads to performance characteristics that neglect the overall collective performance behavior under all operating circumstances.

SUMMARY

To overcome the drawbacks of the prior art and provide additional benefits, an assembly is disclosed that comprises an arrangement of insulating material and conductive material configured to establish an electrical connection between a circuit board and a die. The disclosed designs were created to provide a cost effective manufacturable design that eliminates or minimizes differential-mode and common-mode mismatches along the transmission path made up of 1) die bond pads, 2) bond wires, 3) lead frame bond pads, 4) lead frame, 5) lead frame-to-pin transition, 6) pin-to-PCB transition, and 7) PCB transmission line.

In one embodiment, the assembly comprises a circuit board, a package and a die. The circuit board includes a circuit board conductive layer serving and configured as a ground plane, a circuit board insulating layer on the conductive layer, one or more ground vias electrically connected to the circuit board conductive layer, one or more signal solder pads on the insulating layer, one or more signal transmission lines formed from conductive material on the insulating layer such that the one or more signal transmission lines terminate at the one or more signal solder pads, and a circuit board ground pad electrically connected to two or more ground vias such that the two or more ground vias are electrically connected to the circuit board conductive layer. The ground pad has a concave shaped edge facing the one or more signal solder pads.

The package comprises an insulating material and conductive material. The package comprises two or more conductors exposed on a package exterior including at least one conductor comprising an exterior ground conductor and at least one conductor comprising an exterior signal conductor such that the exterior signal conductor is configured to electrically connect to at least one signal solder pad on the circuit board and the exterior ground conductor is configured to electrically connect to at least one ground via on the circuit board.

The package may further comprise a right hand side ground path electrically connected to the circuit board ground pad, a left hand side ground path electrically connected to the circuit board ground pad, a center ground path electrically connected to the circuit board ground pad, a first signal path between the right hand side ground path and the center ground path such that the first signal path connects at a first end to at least one signal transmission line of the circuit board and connects at a second end to a first bond wire, and a second signal path between the left hand side ground path and the center ground path such that the second signal path connected at a first end to at least one signal transmission line of the circuit board and connected at a second end to a second bond wire such that the first and second bond wires electrically connect to a die.

In one embodiment, a generally uniform distance is maintained between the left hand side ground path and the first signal path and a generally uniform distance is maintained between the right hand side ground path and the second signal path. In addition, a generally uniform distance may be maintained between the first signal path and the center ground path and a generally uniform distance may be maintained between the second signal path and the center ground path.

In this assembly, the first signal path and the second signal path may be traces having a uniform width. In addition, the ground bond wires electrically connect the die ground to the right hand side ground path, left hand side ground path, and center ground path. In one embodiment there are five ground vias extending upward through the circuit board and in alignment with exterior ground conductors exposed on a package exterior.

It is further contemplated that the one or more signal solder pads of the circuit board may comprise a first signal solder pad and second signal solder pad, the first signal solder pad electrically connects to the first signal path of the package and the second signal solder pad electrically connects to the second signal path of the package.

Disclosed herein is an assembly comprising an arrangement of insulating material and conductive material configured to establish an electrical connection between a circuit board and a die. In this embodiment, the assembly comprises a circuit board ground layer formed of conducting material and a circuit board insulating layer on the conductive layer. At least one signal transmission line terminating at and electrically connects to the at least one signal solder pad on the circuit board insulating layer. A circuit board ground pad electrically connects to the circuit board ground layer such that the ground pad has a concave shaped edge facing at least one signal solder pad. Also part of this embodiment is a package comprising insulating material and conductive material such that the package includes two or more package ground pads exposed on a package exterior electrically connected to the circuit board ground pad and one or more package signal pads exposed on a package exterior electrically connected to the signal solder pad. Within the package, there is at least a right hand side ground path electrically connected to at least one package ground pad and at least a left hand side ground path electrically connected to at least one package ground pad. A package signal path is between the right hand side ground path and the left hand side ground path such that the package signal path electrically connects at a first end to at least one package signal pad and electrically connects at a second end to a signal bond wire.

One embodiment further comprises a second package signal path within the package and a center ground path electrically connected to the right hand side ground path and the left hand side ground path such that the center ground path is located between the package signal path and second package signal path. The center ground path may have a bond wire attachment point to which a bond wire attaches, the right hand side ground path may have a bond wire attachment point to which a bond wire attaches, and the left hand side ground path may have a bond wire attachment point to which a bond wire attaches. In this embodiment, the distance between the center ground path and the package signal is generally uniform and a distance between the center ground path and the second package signal path may be generally uniform.

The two or more package ground pads on the exterior of the package are aligned above the circuit board ground pad such that the concave shaped edge faces at least one signal solder pad. In one embodiment, the package signal path and second package signal path have a generally uniform width along at least fifty percent of its length.

Also disclosed herein is a circuit board and package assembly configured to electrically connect a die to a circuit board. In this embodiment the assembly comprises a circuit board signal path on an insulating layer of the circuit board terminating in a signal pad and a ground pad on the insulating layer of the circuit board. The circuit board ground pad has a concave shaped side that forms a recess such that at least one signal pad is at least partially within the recess formed by the concave shaped side. A package is part of the assembly and is located on the circuit board such that two or more package ground pads align along the concave shaped side of the circuit board ground pad and at least one package signal pad is at least partially within the recess formed by the concave shaped side of the ground pad. The two or more package ground pads extend upward into the package to electrically connect to package ground paths and the at least one package signal pad extends upward into the package to electrically connect to a package signal path.

In one embodiment, the at least one package signal path extends from the package signal pad toward the die and has a generally constant width. The two or more package ground pads may consist of five package ground pads, all of which are contained within an area defined by the circuit board ground pad and electrically connect to the circuit board ground pad to form a ground return path of controlled characteristics. It is also contemplated that the assembly may include two circuit board signal paths, each connecting to a signal pad and also include two package signal pads which connect to a first package signal path and a second package signal path, both of the first package signal path and a second package signal path extend toward the die and a center ground pad on the circuit board which electrically connects to a center package ground pad, which electrically connects to a package center ground path.

In this embodiment the package center ground path is located between the first package signal path and a second package signal path. Furthermore, the package ground paths may comprise a first package ground path and a second package ground path, both of which extend toward the die, such that the first package signal path is between the first package ground path and the package center ground path and the second package signal path is between the second package ground path and the package center ground path. It is further contemplated that a distance between the first package signal path and the first package ground path is generally consistent as the first package signal path extends toward the die and a distance between the second package signal path and the second package ground path is generally consistent as the second package signal path extends toward the die.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
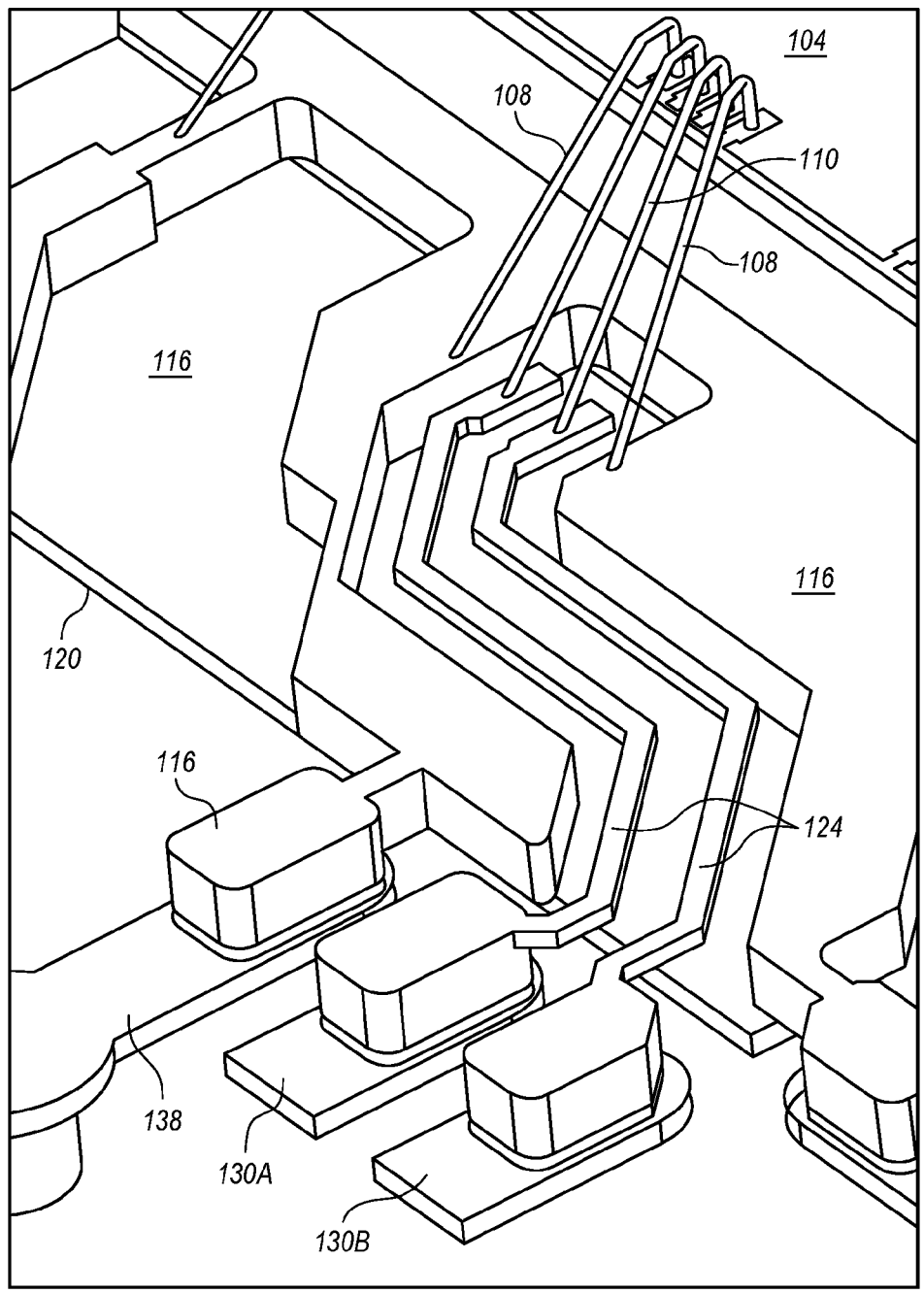
FIG. 1 is a perspective view of a prior art package to die interface.
Figure 2A:
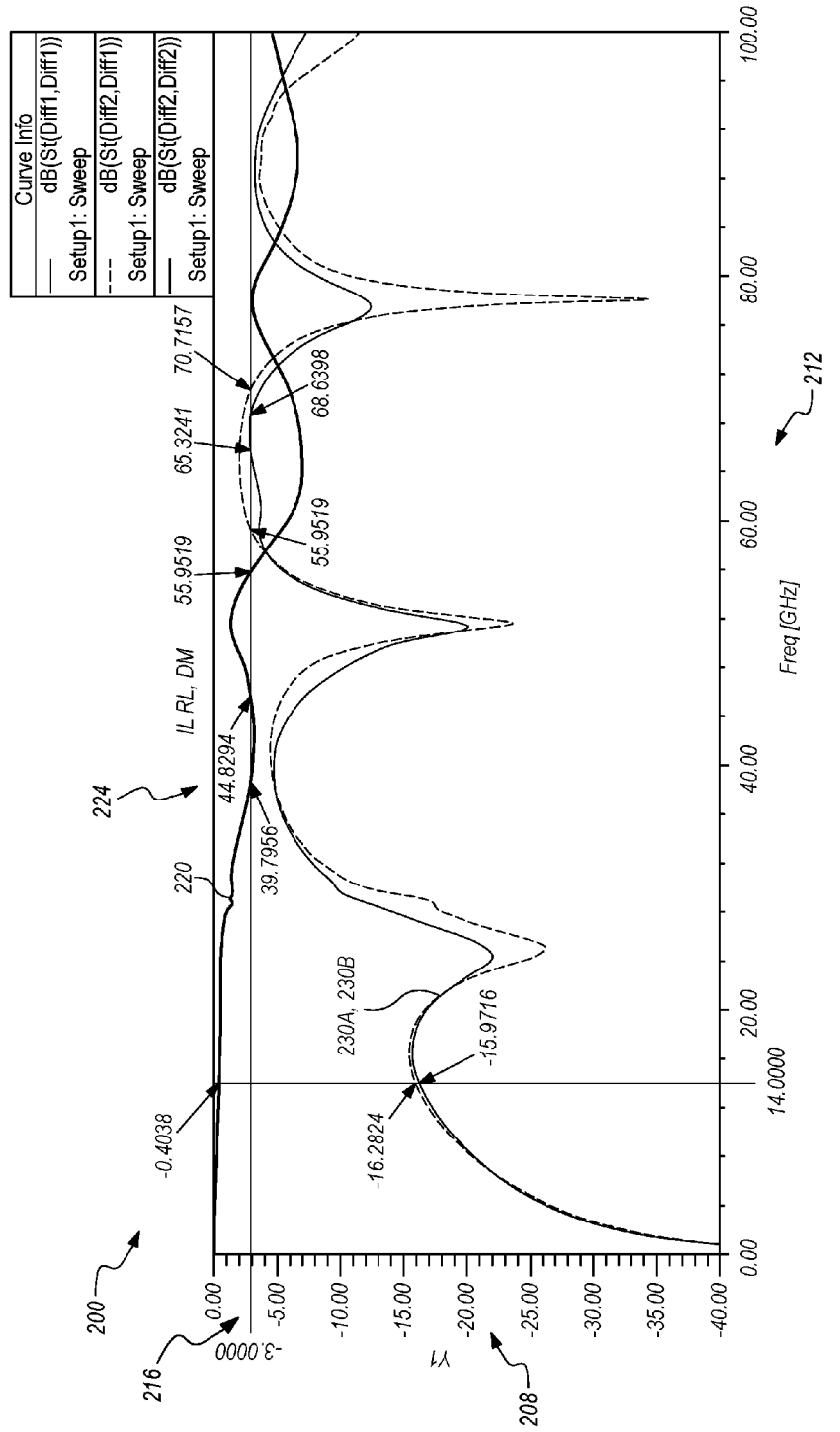
FIG. 2A is a plot of signal magnitude and a plot of return loss in differential mode in a prior art system at various frequencies.

FIG. 2A is a plot of signal magnitude and a plot of return loss in differential mode in a prior art system at various frequencies. As shown in FIG. 2A, in the graph 200 the vertical axis 208 represents dB of signal loss while the horizontal axis 212 represents frequency in GHz. On the vertical axis a −3 dB point 216 is a relevant point for this discussion and may be used to define or compare system performance. A signal plot 202 is shown as plot 220. This signal plot is −3 dB down in signal magnitude at about 40 GHz of signal frequency 224. This is typical of prior art system performance.

Also shown in FIG. 2A is return loss plots 230A, 230B for differential mode operation. One plot is referenced looking into or toward the die from the circuit board while another of the plots is looking toward or into the circuit board from the die. As can be viewed from the return loss plots 230A, 230B for differential mode operation, the prior art systems suffer from significant return loss and the return loss behavior is inconsistent over the illustrated frequency range.

Figure 2B:
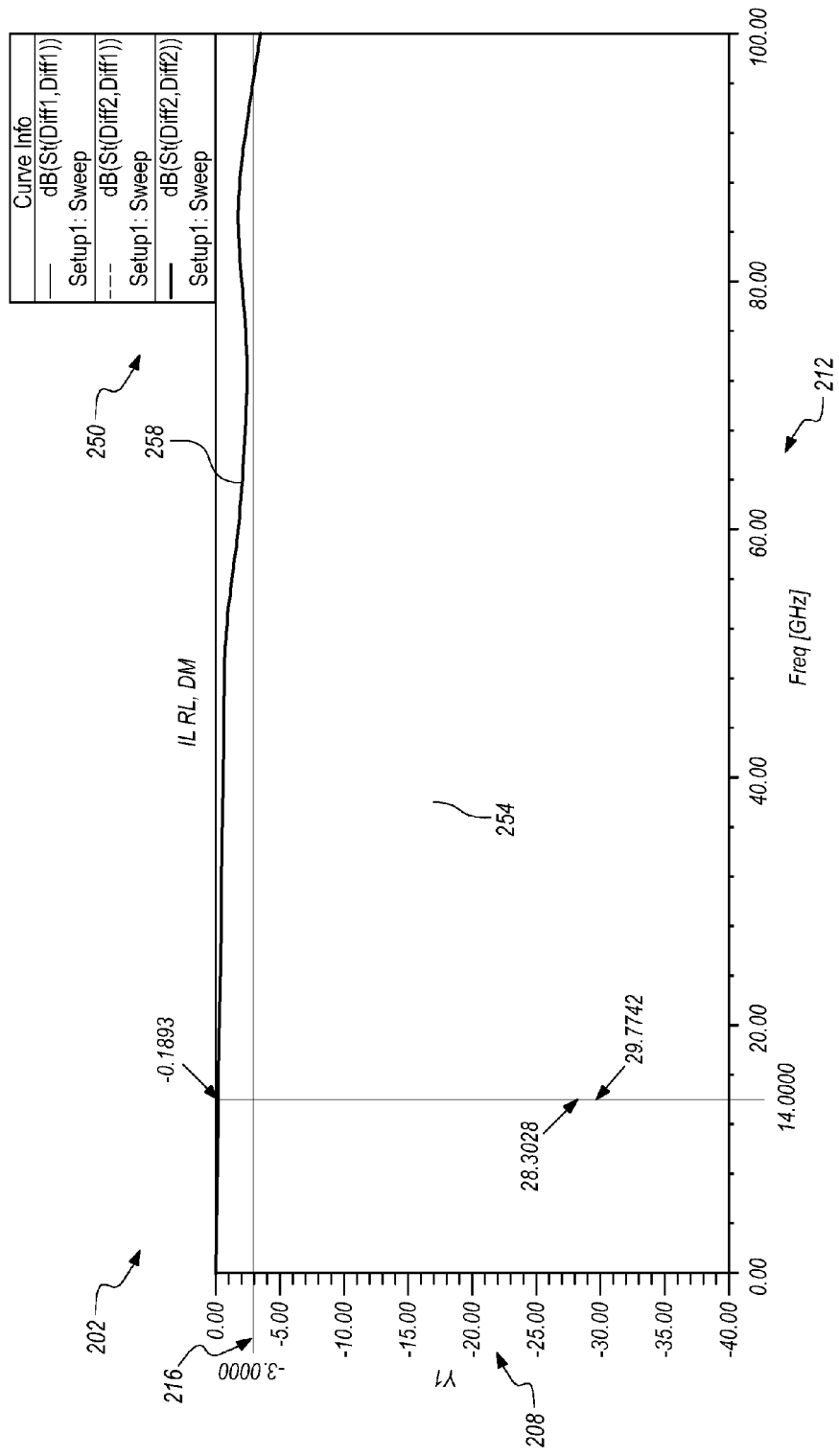
FIG. 2B is a plot of signal magnitude and a plot of return loss in differential mode in a system embodied with the disclosed innovation at various frequencies.

FIG. 2B is a plot of signal magnitude and a plot of return loss in differential mode in a system embodied with the disclosed innovation at various frequencies. As compared to FIG. 2A, similar elements are identified with similar reference numbers. As shown in FIG. 2B, in the graph 200 the vertical axis 208 represents dB of signal loss while the horizontal axis 212 represents frequency in GHz. In contrast to FIG. 2A, the plot of signal magnitude 258 is significantly better such that the −3 dB transition 216 [in signal magnitude is at or near 100 GHz 250. This is a significant improvement in performance and enables operation at significantly higher frequencies.

Also shown in FIG. 2B is return loss plots 254A, 254B. One plot is referenced looking into or toward the die from the circuit board while another of the plots is looking from die into or toward package. As can be viewed from the return loss plots 230A, 230B, the system incorporating the disclosed innovation greatly improves performance in relation to return loss compared to the prior art system plots shown in FIG. 2A. The return loss plot 254A, 254B are better over the shown frequencies and do not suffer from significant variation.

Figure 3A:
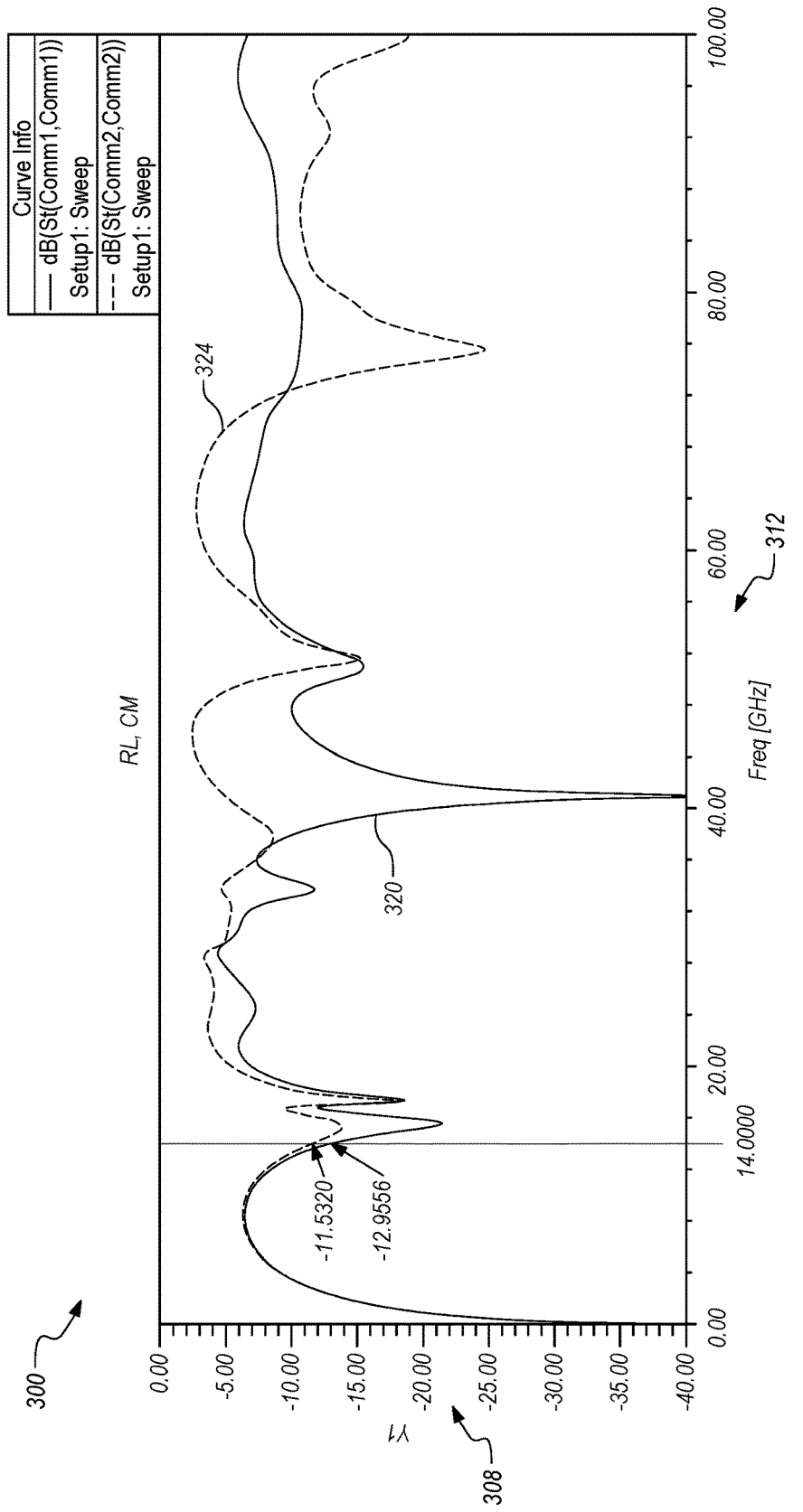
FIG. 3A is a plot of return loss in common mode in a prior art system operating at various frequencies.

FIG. 3A is a plot of return loss in common mode in a prior art system operating at various frequencies. As shown in FIG. 3A, in the graph 300 the vertical axis 308 represents dB of signal loss while the horizontal axis 312 represents frequency in GHz. Also shown in FIG. 3A is return loss plots 320, 324 for common mode operation. Plot 320 is referenced looking into or toward the die from the circuit board while plot 324 is looking from the circuit board into or toward die. As can be viewed from the return loss plots 320, 324 for common mode operation, the prior art system suffers from significant return loss and the return loss behavior is inconsistent and include numerous spikes over the illustrated frequency range.

Figure 3B:
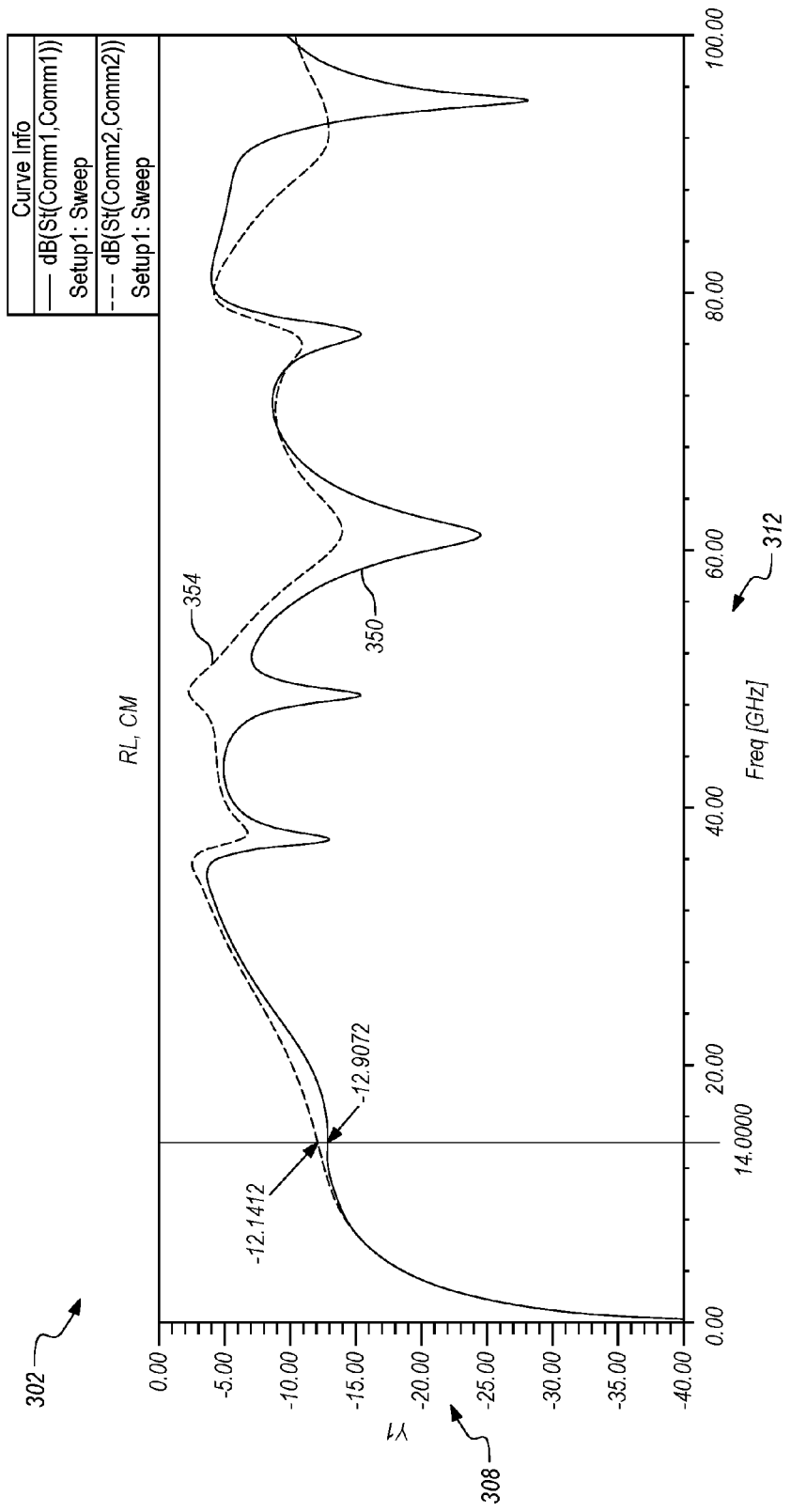
FIG. 3B is a plot of signal magnitude and a plot of return loss in common mode in a system embodied with the disclosed innovation operating at various frequencies.

FIG. 3B is a plot of signal magnitude and a plot of return loss in common mode in a system embodied with the disclosed innovation operating at various frequencies. As shown in FIG. 3B, in the graph 3020 the vertical axis 308 represents dB of signal loss while the horizontal axis 312 represents frequency in GHz. Also shown in FIG. 3B is return loss plots 350, 354 for common mode operation. Plot 350 is referenced looking into or toward the die from the circuit board while plot 354 is looking from the circuit board into or toward the die. As can be viewed from the return loss plots 350, 354 for common mode operation, the system incorporating the innovation disclosed herein has a significant improvement in return loss and the return loss behavior is more consistent and include fewer spikes over the illustrated frequency range as compared to the prior art plots shown in FIG. 3A.

Figure 4:
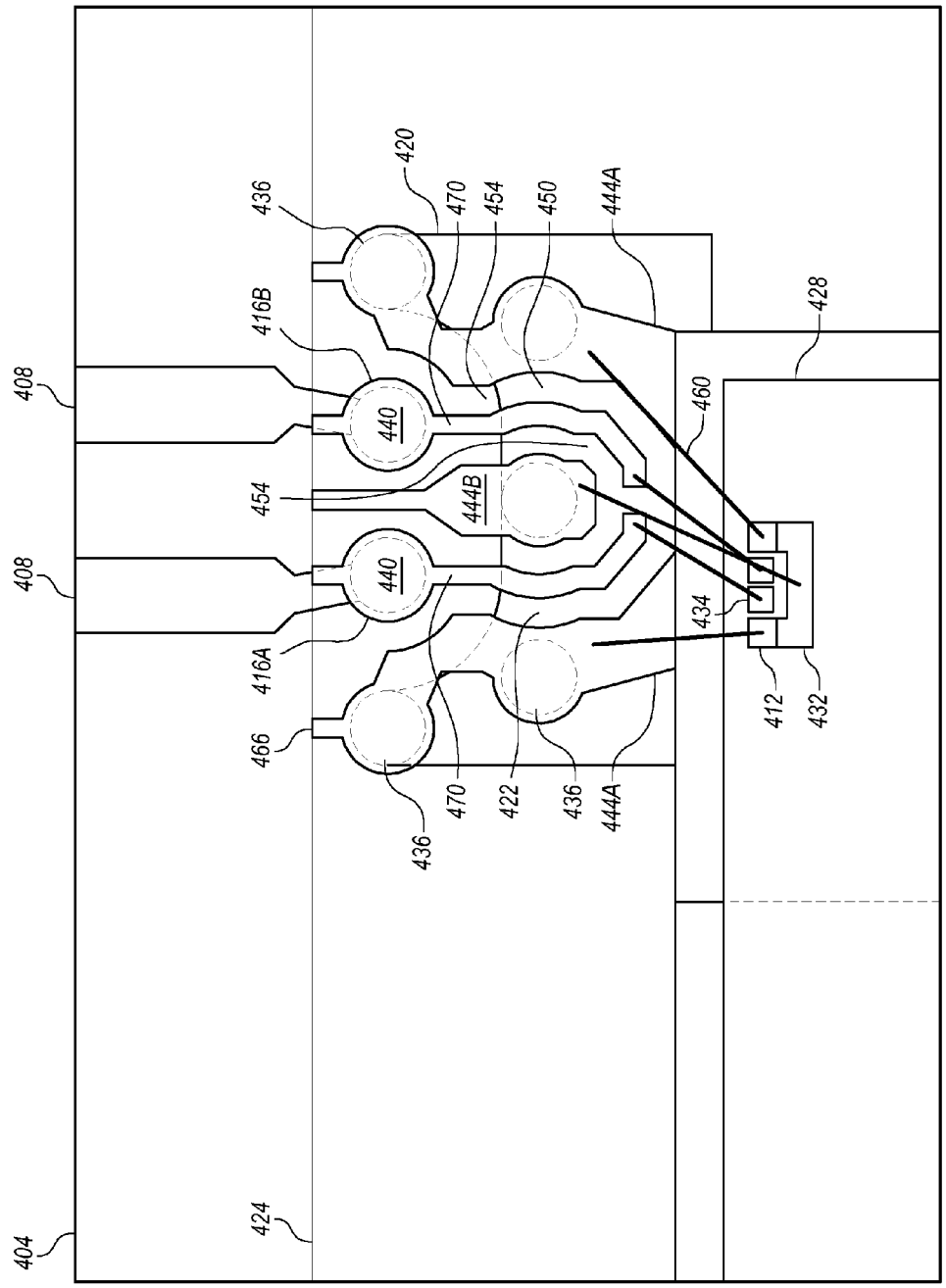
FIG. 4 a top plan view of the circuit board, package, and die with associated electrical connectivity.
Figure 5:
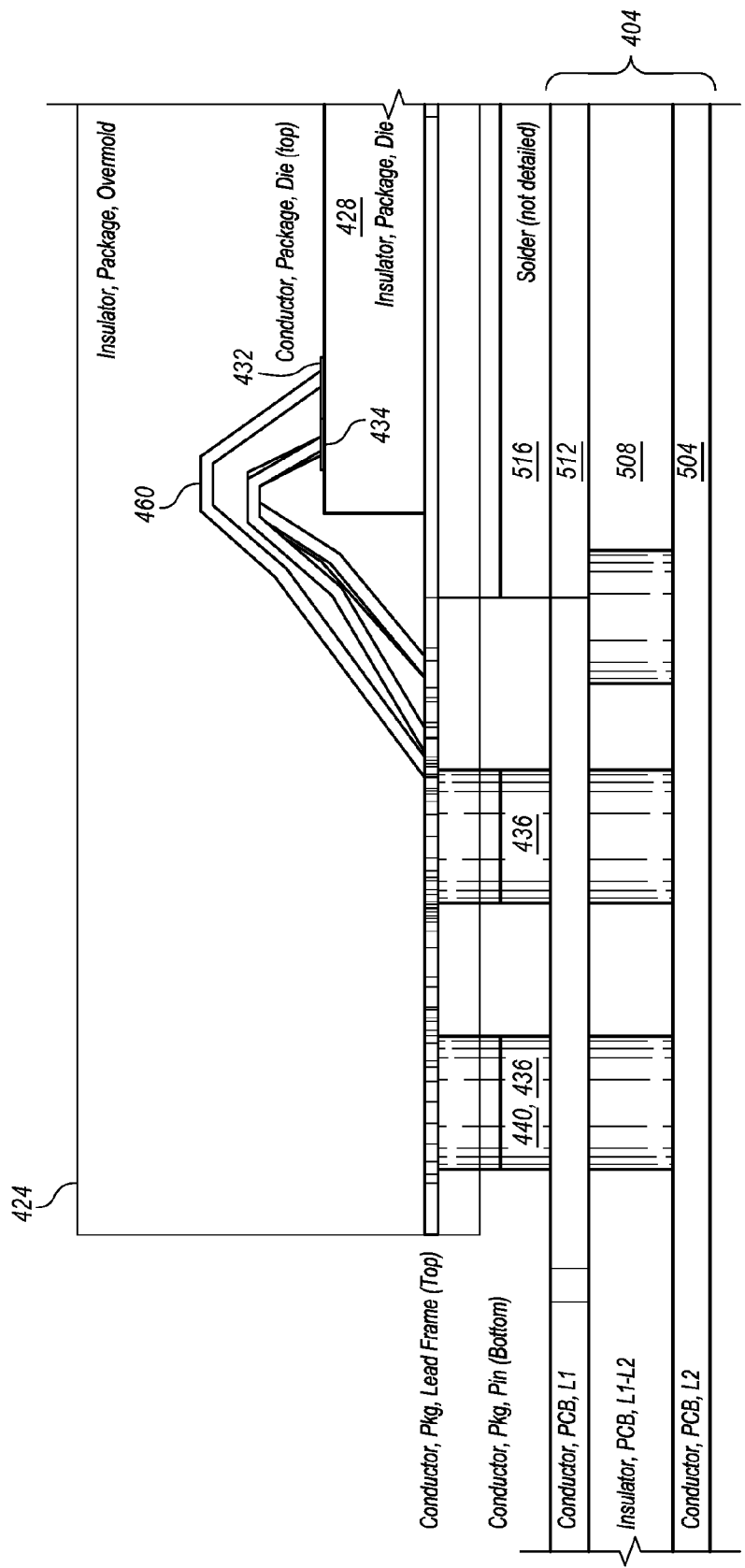
FIG. 5 is a side plan cut-away view of the circuit board, package, and die with associated electrical connectivity.
Figure 6:
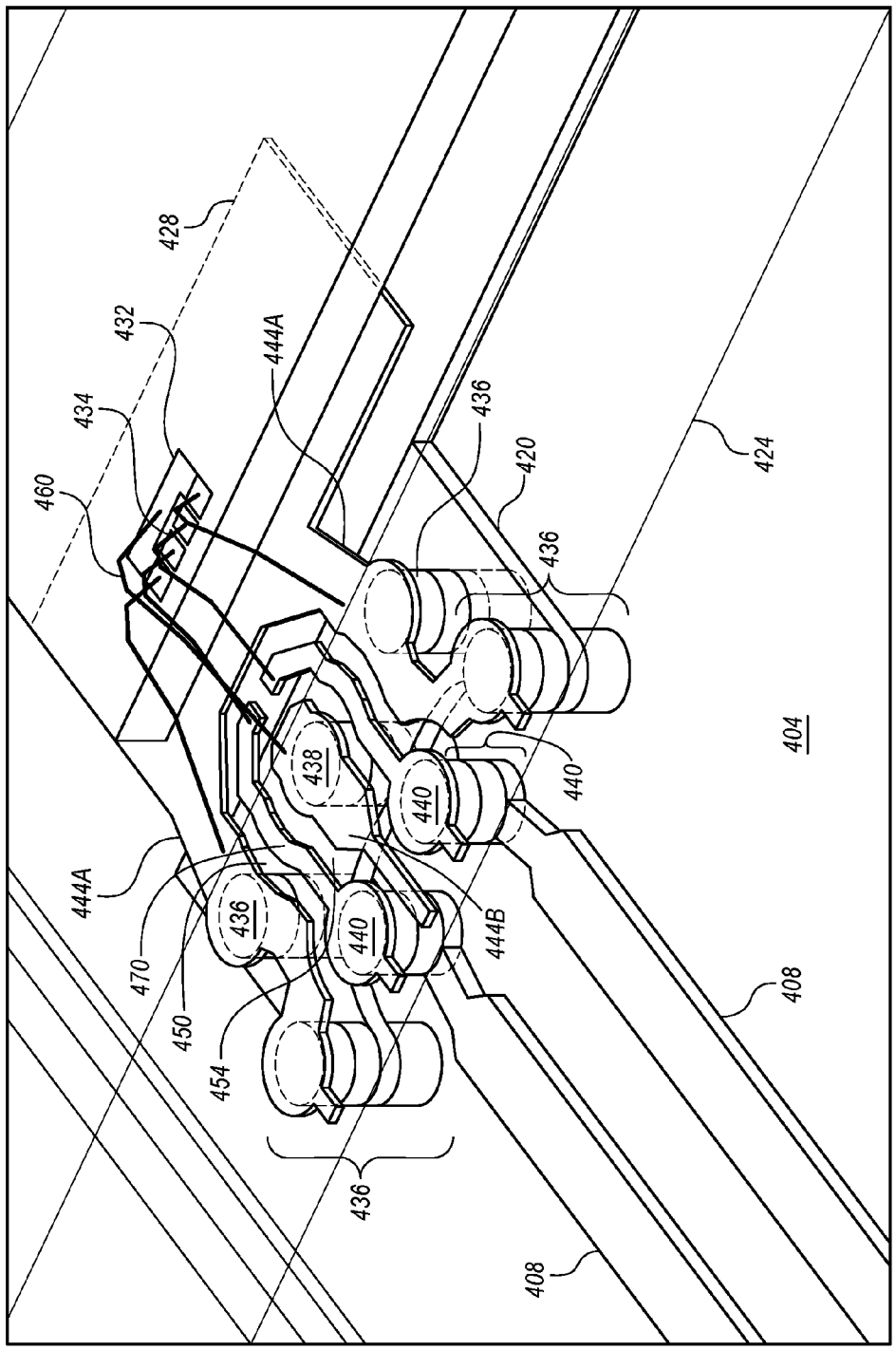
FIG. 6 is a perspective cut-away view of the circuit board, package, and die with associated electrical connectivity.

FIG. 4 a top plan view of the circuit board, package, and die with associated electrical connectivity. FIG. 5 is a side plan cut-away view of the circuit board, package, and die with associated electrical connectivity. FIG. 6 is a perspective cut-away view of the circuit board, package, and die with associated electrical connectivity. FIGS. 4, 5, and 6 are jointly discussed below to avoid redundancy between elements which are generally similar but shown in different views. In general, FIGS. 4, 5, and 6 illustrate an electrical interface between a circuit board 404, package 424, and die 428. This interface is a built-up three dimensional arrangement of insulating elements and conductive elements arranged to electrically interface the circuit board 404 to the die 428.

As is commonly understood, a circuit board 404, which may be a multi-layer printed circuit board, is composed of various conductive and insulating layers. In this embodiment, a lower conductive layer 504 serves as a base layer. Above the lower conductive layer 504 is an insulating layer 508. In turn, above insulating layer 508 is another conductive layer 512 which when combined with selective conductor location control and insulating material location control may be made to establish one or more signal transmission line 408 on the circuit board 404 and a ground plane 420. As shown in FIG. 6, the signal transmission line 408 are part of the circuit board 404 and terminate at a signal via 440. The signal transmission line 408 may operate in differential mode, common mode, or both, subject to other elements including the die and the components which connected to the circuit board 404.

The signal transmission line 408 connects to the vias 440 which extended through the circuit board 404 to present a signal solder pad at the top of the circuit board. Subsequent figures illustrates the location of the signal solder pads in relation to the package. In this example embodiment the signal solder pads may be for use with a traditional package design with pins extending from the periphery of the package or arranged in an array for a flip chip configuration. Also part of the circuit board 404 is a ground path or ground plane that connects to ground vias 436. The ground vias present an electrical connection from a ground path or ground plane from the circuit board to the package. As with the signal solder pads for the signal path, the ground connects are also presented to the upper level of the circuit board for connection to the package 428.

Turning now to the package 424, several electrical connections are provided to electrically connect the package to the die 428. In general, there is a signal path and a ground path. With regard to the signal path, the circuit board transmission lines 408 connect to the package through conductive vias 440 and then to package signal paths 470. Pads electrically connect the vias 440 to the package signal paths 470. The package signal paths 470 extend toward the die 428 as shown and terminate near the die 428 and within connection distance to the die.

In addition to the signal paths 470, ground nodes are provided which include outer ground node (paths) 444A, located on each side of the signal paths 470 as shown, and an inner ground node (path) 444B located between the signal paths 470. Both the ground nodes 444A, 444B, and the signal paths 470 may comprise any type of conductive material. The ground nodes 444A connect to outer ground vias 436 and solder pads (not shown) which extend through and upward from the circuit board 404. A center (inner) ground node 444B connects to an electrically conductive via 438, which in turn connects to the lower ground plane 420.

The lower ground plane 420 that extends outward from each via 436, 438 to form a conductive ground plane as shown. The ground plane includes a concave arc 422 that opposes the two signal vias 440. The concave side 420 of the ground extends to each side of the signal vias 440. One or more ground vias 436 are located near the outer most portions of the ends of the concave arc.

Bond wire contact points are located generally near the die to which bond wires 460 connect to the package signal paths 470. The opposing end of the bond wires 460 connect to bond wire pads on the die 428. Although labeled with a single reference number 460, the certain bond wires conduct the signal while others conduct or function as ground conductors. Bond wires 460 which connect to the signal path on the package 424 and die 428 are signal bond wires while bond wires which connect to ground paths on the package and die are ground bond wires. Additional details regarding the bond wire 460 contact points are provided below.

Between the outer ground nodes 444A and the signal path 470 is a space or void comprised of insulating material. An inner insulating section 454 is placed between inner ground node 444B and the signal paths 470. An outer insulating section 450 is provided between the signal path 470 and the outer ground nodes 444A. As shown in this embodiment the arrangement is symmetric such that both sides of the inner ground node are mirrored images of the other. In other embodiments the arrangement may be non-symmetric. Further and as discussed herein, the performance improvements are based at least in part on the configuration shown but deviations may occur from this configuration without departing from the claims that follow. Deviations in configuration shape and layout which gain the benefits described herein are contemplated and should be considered as covered directly or by the doctrine of equivalents.

In this example embodiment, which was configured for simulation and manufacturing, the nature of the manufacturing process leaves tails 466 extending from the features of the design and in particular the ground nodes 444A, 444B and the package signal paths 470. Element 416B is a bond pad or connection pad between the vias 440 that extends upward from the lower levels of the package 424 and the signal transmission lines 408.

FIG. 5 and FIG. 6 also illustrate the multiple tier bonding arrangement for the ground areas. As shown in FIG. 5, the top most bond wires 460 connect to a ground area, which in turn electrically connects to a lower tier ground area through the conductive vias 436, 440. One or more lower tiers may be connected in this manner. This is also shown in FIG. 6 such that the upper ground areas 444A, 444B connect to lower ground tiers through vias, such as vias 436. Using two or more tiers with bonding to lower ground layers provides the benefit of flexibility to assign and arrange conductors to facilitate management of modal impedance characteristics within the constraints of technology and manufacturing design rules as well as for specific product needs.

The present design has several advantages over prior art systems. Present design is optimized and designed to meet specification for both common mode and differential mode behavior. Thus, the modal impedances are both optimized. As to the modality designed into the system, the design disclosed improves greatly upon prior art designs by better balancing modal impedances to achieve the lowest possible impedance variation for each of the major modes—differential and common modes Achieving the lowest possible impedance variation manifests as improved bandwidth, improved return loss, and reduced signal distortion due to resonances caused by interaction of mismatches.

Figure 7A:
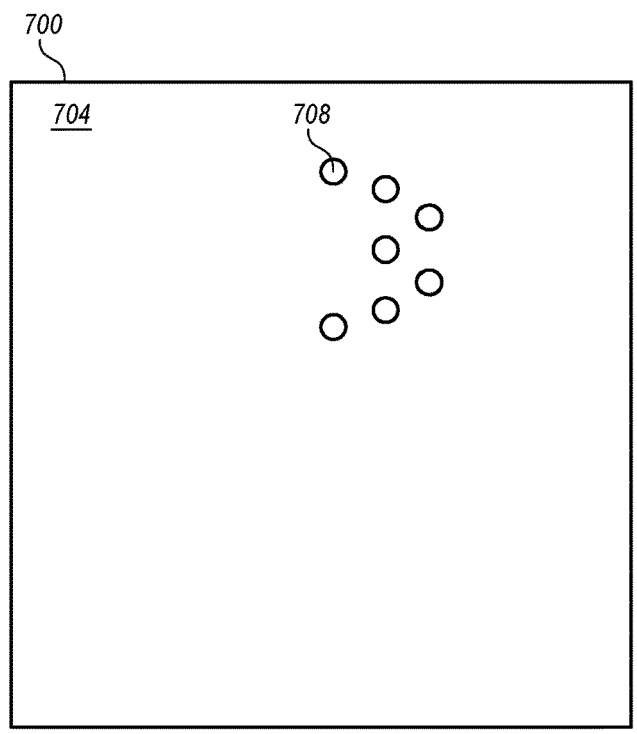
FIG. 7A illustrates a top view of a layer of the circuit board formed of conductive material.

FIGS. 7A-7H illustrates the various layers of an exemplary embodiment of the circuit board, package, and die for the configuration described herein. This is but on one possible layer stack up. FIG. 7A illustrates a top view of a layer of the circuit board formed of conductive material. The area shown generally is a portion of the circuit board 700 which is a conductive layer 704 covering the circuit board while via locations 708 are shown as circles or other conductive access areas where the vias are located. The conductive layer 704 forms an RF ground layer. The circuit board 700 may be any type circuit board, such as a layered circuit board, printed circuit board, or other type of support structure. That circuit board 700 may be of any shape and the view shown in FIG. 7A is just a section of the overall board. The layer shown in FIG. 7A may be considered a base layer, such that the other layers or elements shown in FIG. 7B-7H reside on top of the layer shown in FIG. 7A.

Figure 7B:
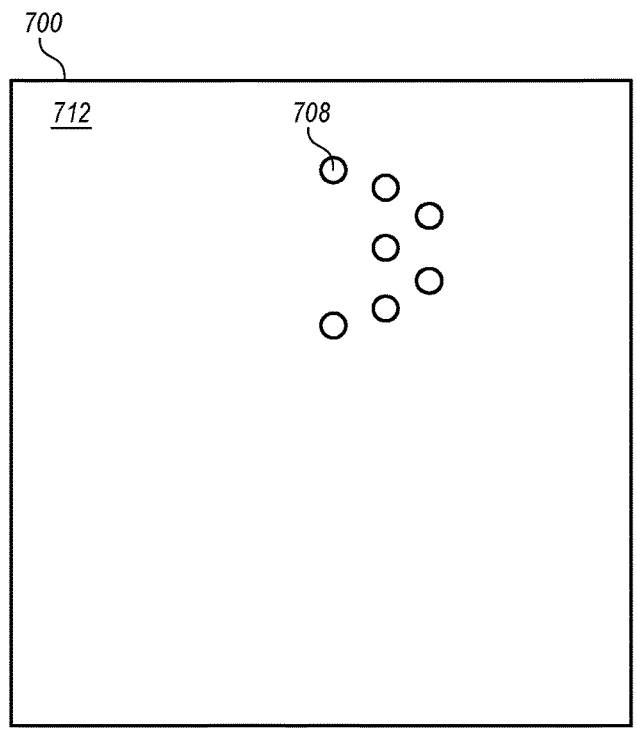
FIG. 7B illustrates a top view of an additional layer of the circuit board formed of insulating material.

FIG. 7B illustrates a top view of an additional layer of the circuit board formed of insulating material. This insulating layer 712 is on top of the conductive layer 704 shown in FIG. 7A. Shown through the insulating layer 712 are the conductive via locations 708, which electrically connect to the conductive layer below and conductive layer above.

Figure 7C:
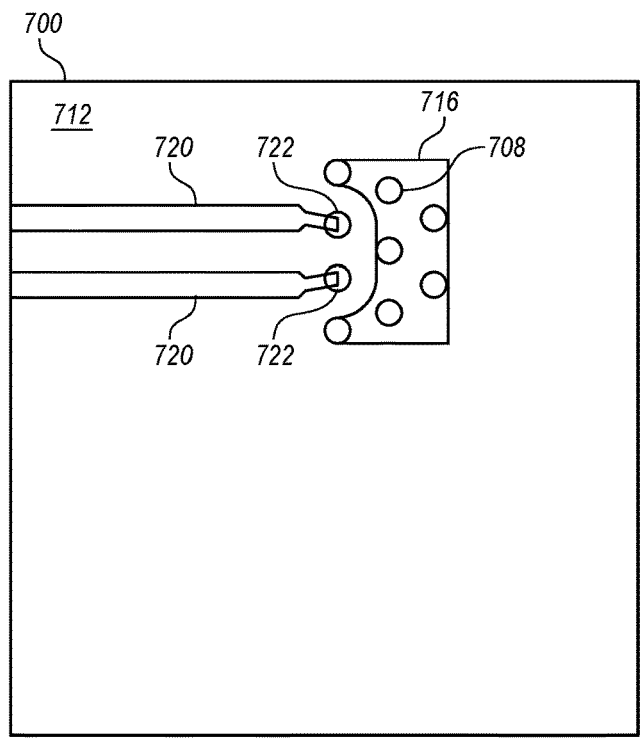
FIG. 7C illustrates a top view of an additional layer of the circuit board formed of conductive material.

FIG. 7C illustrates a top view of an additional layer of the circuit board formed of conductive material. This layer includes the upper ground plane 716 that electrically connects to the via locations 708, which in turn connect to the conductive ground plane 704 shown in FIG. 7A. This layer also includes the signal transmission lines 720 which electrically connect to solder pads 722. The signal transmission lines 720 may be micro-strip lines. One skilled in the art may contemplate that if the signal transmission lines 720 were sandwiched between adjacent (above and below) ground planes, then stripline transmission lines would result. While the figures and illustrated embodiment do not detail this case, the case should be contemplated included and considered as covered by subsequent claims either directly or by the doctrine of equivalents. Returning to FIG. 7C, the features described reside atop the insulating layer 712 of the circuit board 700. The upper ground plan 716 may be referred to as a metal flood. As shown, the edge that faces or opposes the transmission lines solder pads 722 is concave to at least partially curve around the solder pads. In this embodiment there are seven vias that are part of the ground path but in other embodiments greater or fewer vias may be used. In this embodiment the ground vias 708 are located and spaced in a uniform manner in relation to the signal solder pads. Analogous to the description of multi-tiered bond wire use and arrangement, the placement of the ground pads and vias has the benefit of allowing management of modal impedance characteristics within the constraints of technology and manufacturing design rules as well as for specific product needs. It should be understood that the locations, dimensions, and quantity of connections may differ in other embodiments. However, all possible variations should be covered within the scope of claims and in particular following the pattern of forming a generally concave ground shape opposing the signals. Heat dissipation vias are used for heat dissipation from the die to the package to the circuit board and are not shown in this figure. The via locations are not limited to the locations shown.

Figure 7D:
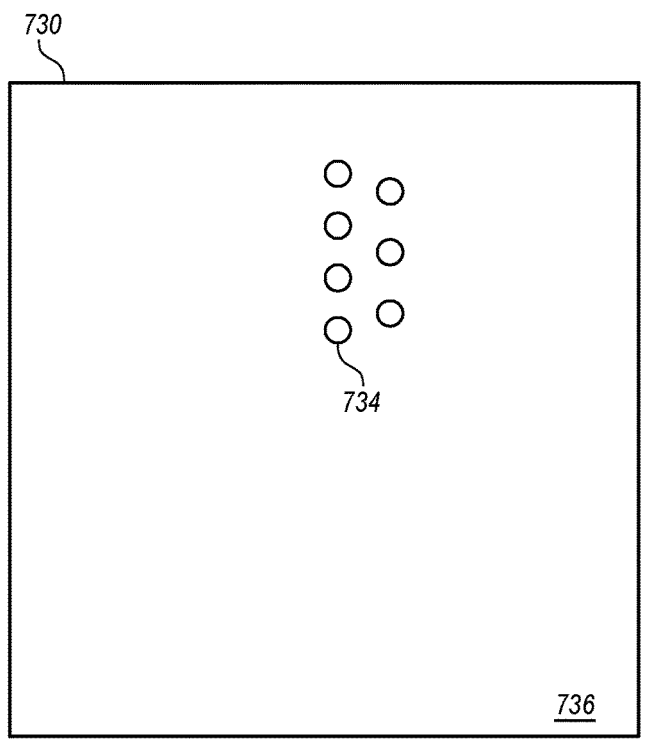
FIG. 7D illustrates a bottom view of a layer of the package formed of conductive material.
Figure 7E:
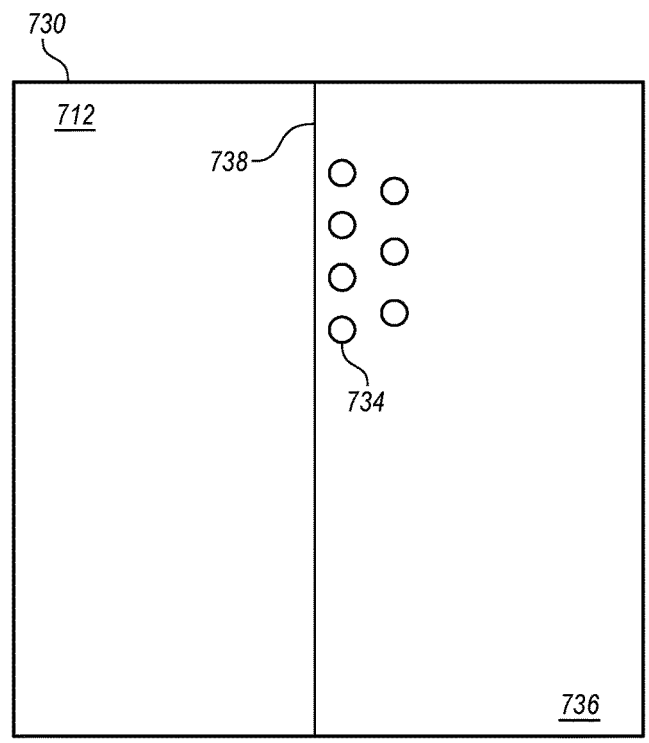
FIG. 7E illustrates a bottom view of a layer of the package formed of insulating and conductive material.

FIG. 7D illustrates a bottom view of a layer of the package formed of conductive material. As shown, the package 730 has a bottom which is comprise primarily of insulating material 736 such as an epoxy overmold. The package pins 734 protrude from the package 730 as shown. The pin 734 may comprise solder bumps, pins, solder balls, or any other conductive feature on the package. FIG. 7E illustrates a bottom view of a layer of the package formed of insulating and conductive material. This view is generally similar to FIG. 7D, but the package edge 738 is shown imposed on top of the circuit board 712. In the present embodiment an array of pins are illustrated. In other embodiments the pins may reside along the package edge 738 in what is commonly known as a peripheral array of pins.

Figure 7F:
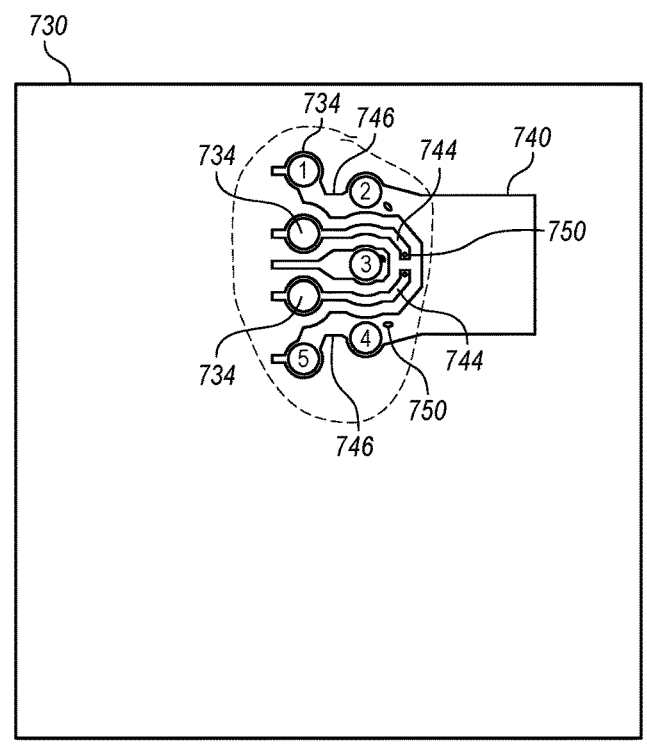
FIG. 7F illustrates a top view of an additional layer of the package formed of conductive material.

FIG. 7F illustrates a top view of an additional layer of the package formed of conductive material. This layer is one layer up within the package assembly and the sections shown are conductive layers. The package pins 734 of the package electrically connect to the conductors 746, 744 which are established as conductive areas of this layer. The package pins 1-5 are all part of a common ground which includes package ground conductive areas 740 and conductive wings 746. The package ground conductive areas 740 electrically connects all the package grounds together. The signal package pins 734 are established within the package as shown such there is a signal path 744 which extends from the package pins 734 as shown. The signal pins may carry signals in differential mode or common mode. There is a uniform distance between the ground wings 746 and the signal paths 744. Between the signal paths 744 is a ground pin (3) with associated ground conductor established as shown. The ground pin (3) and the associated ground area that is located at a uniform distance from the signal paths 744 provides an important return path to ground for the signals. Presence of this ground allows adjustment of electro-magnetic coupling between the two signal paths 744 and hence allows adjustment of modal impedance within the package planar signal routing region. A uniform distance is maintained between the ground pin conductor and the signal paths 744. Also shown in FIG. 7F are the bond wire contact points 750. The bond wires (not shown) connect the package 730 to the die (not shown). Certain bond wires will electrically connect to the signal conductors 744 to the die while other bond wires will electrically connect the ground path 740, 746, and package pin (3) to the die. As a benefit to this arrangement, the size and distance of the arrangement shown may ratio up or down in size to accommodate other sizes of dies and/or other package technology design and manufacturing rules. The scaling may occur left to right or top to bottom and is contemplated that the scaling would also occur in the Z-axis.

Figure 7G:
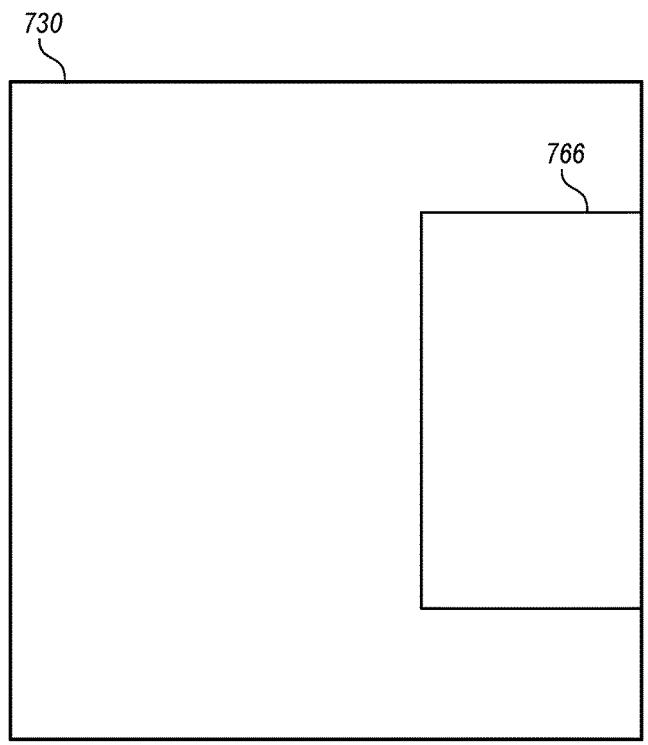
FIG. 7G illustrates a view of a layer of the package and die formed of insulating material.
Figure 7H:
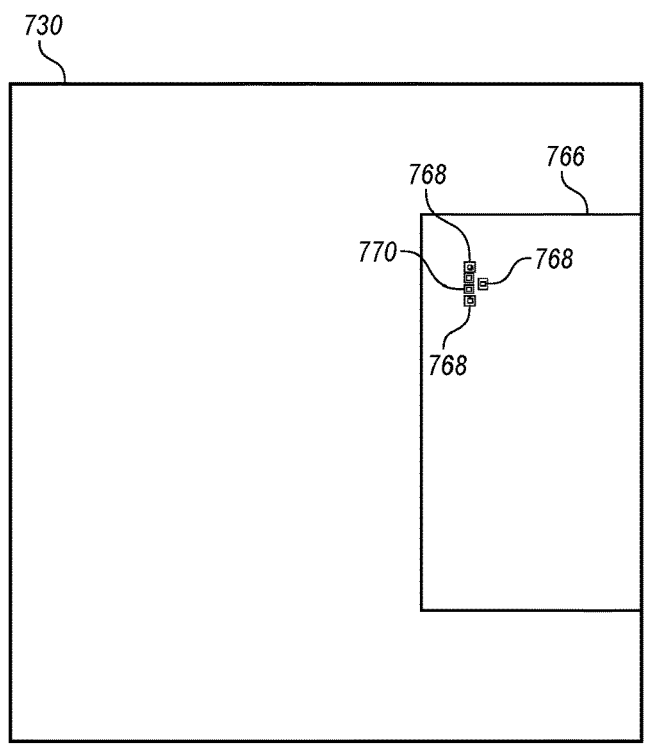
FIG. 7H illustrates a top view of a layer of the package and die formed of conductive material.

FIG. 7G illustrates a view of a layer of the package and die. In this view the die 766 is on the package 730. FIG. 7H illustrates a top view of the die with die bond pad 768, 770. The bond pads 770 are for the signal path and the bond pads 768 connect the die to the ground conductor of the package. The dots at the center of each bond pad 768, 770 are bond wire contact points.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A package comprising an arrangement of insulating material and conductive material configured to establish an electrical connection between a circuit board and a die, the package comprising:

the package comprising:
 a package insulating layer;
 one or more ground vias configured to electrically connect to a circuit board conductive ground layer;
 one or more signal pads on the package;
 one or more signal vias formed from conductive material signal vias configured to electrically connect the one or more signal pads to the circuit board;
 a package ground pad electrically connected to two or more ground vias, the two or more ground vias configured to electrically connect to the circuit board conductive ground layer, the package ground pad having a generally concave shaped edge facing the one or more signal pads;

the package further comprising:

two or more conductors exposed on a package exterior, at least one conductor comprising an exterior ground conductor and at least one conductor comprising an exterior signal conductor such that the exterior signal conductor is configured to electrically connect to the circuit board and the exterior ground conductor is configured to electrically connect to the circuit board.

2. The package of claim 1 further comprising:
a right hand side ground path electrically connected to the package ground pad;
a left hand side ground path electrically connected to the package ground pad;
a center ground path electrically connected to the package ground pad;
a first signal path between the right hand side ground path and the center ground path; and
a second signal path between the left hand side ground path and the center ground path.

3. The package of claim 2 wherein a generally uniform distance is maintained between the left hand side ground path and the first signal path and a generally uniform distance is maintained between the right hand side ground path and the second signal path.

4. The package of claim 3 wherein a generally uniform distance is maintained between the first signal path and the center ground path and a generally uniform distance is maintained between the second signal path and the center ground path.

5. The package of claim 2 wherein the first signal path and the second signal path are traces having a uniform width.

6. The package of claim 1 wherein ground bond wires electrically connect a die ground to the right hand side ground path, left hand side ground path, and center ground path.

7. The package of claim 1 wherein there are five or more ground vias extending upward from the circuit board and in alignment with the exterior ground conductors exposed on the package exterior.

8. The package of claim 1 wherein the one or more signal pads of the package comprise a first signal pad and second signal pad, the first signal pad electrically connects to a first signal path of the die and the second signal pad electrically connects to a second signal path of the die.

9. An assembly comprising an arrangement of insulating material and conductive material configured to establish an electrical connection between a circuit board and a die, the assembly comprising:
a package comprising insulating material and conductive material, the package comprising:
two or more package ground pads exposed on a package exterior electrically configured to connect to a circuit board ground pad;
one or more package signal pads exposed on a package exterior electrically configured to connect to a signal pad on a circuit board; and
within the package, at least a right hand side ground path electrically connected to at least one package ground pad and at least a left hand side ground path electrically connected to at least one package ground pad;
a package signal path between the right hand side ground path and the left hand side ground path, the package signal path electrically connected at a first end to at least one package signal pad and electrically connected at a second end to a signal bond wire, wherein the right hand side ground path and the left hand ground path form a generally concave shaped edge facing the one package signal path.

10. The assembly of claim 9 further comprising a second package signal path within the package and a center ground path electrically connected to the right hand side ground path and the left hand side ground path, the center ground path electrically connected to the right hand side ground path and the left hand side ground path and located between the package signal path and second package signal path.

11. The assembly of claim 10 wherein the center ground path has a bond wire attachment point to which a bond wire attaches, the right hand side ground path has a bond wire attachment point to which a bond wire attaches, and the left hand side ground path has a bond wire attachment point to which a bond wire attaches.

12. The assembly of claim 10 wherein a distance between the center ground path and the package signal is generally uniform and a distance between the center ground path and the second package signal path is generally uniform.

13. The assembly of claim 9 wherein the package is a flip chip configuration.

14. The assembly of claim 9 wherein a signal path is generally parallel to a ground path.

15. A package assembly configured to electrically connect a die to a circuit board, the package assembly comprising:
a package configured to be located on the circuit board such that the package includes:
two or more package ground pads in electrical connection with the circuit board and in electrical connection with a ground conductive area and ground conductive wings, the ground conductive area and ground conductive wings forming a concave shaped side which forms a recess; and
at least one package signal pad located at least partially within the recess formed by the concave shaped side of the ground conductive area and ground conductive wings, the two or more package ground pads extending upward into the package to electrically connect to package ground paths and the at least one package signal pad extending upward into the package to electrically connect to a package signal path.

16. The assembly of claim 15 wherein the at least one package signal path extends from the package signal pad toward the die and has a generally constant width.

17. The assembly of claim 15 wherein the two or more package ground pads consists of five package ground pads, all of which are contained within an area defined by a circuit board ground pad and the five package ground pads electrically connect to the circuit board ground pad to form an RF signal reference and ground return path.

18. The assembly of claim 15 wherein the assembly is in a flip chip configuration.

19. The assembly of claim 18 wherein the package ground paths comprise a first package signal path and a second package signal path, both of which extend toward the die, such that the first package signal path is between a first ground conductive wing and a package center ground path and the second package signal path is between a second ground conductive wing and the package center ground path.

20. The assembly of claim 19 wherein a distance between the first package signal path and the ground conductive area and ground conductive wings is generally consistent as the first package signal path extends toward the die and a distance between the second package signal path and the ground conductive area and ground conductive wings is generally consistent as the second package signal path extends toward the die.

\* \* \* \* \*